(12) United States Patent
Rajasekhar et al.

(10) Patent No.: US 7,391,241 B2
(45) Date of Patent: Jun. 24, 2008

(54) BIDIRECTIONAL DEGLITCH CIRCUIT

(75) Inventors: Suribhotla V. Rajasekhar, Plano, TX (US); Hasibur Rahman, Richardson, TX (US); Alexander Noam Teutsch, Murphy, TX (US); William E. Grose, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 150 days.

(21) Appl. No.: 11/192,969

(22) Filed: Jul. 29, 2005

(65) Prior Publication Data

US 2006/0103432 A1    May 18, 2006

Related U.S. Application Data

(60) Provisional application No. 60/627,919, filed on Nov. 15, 2004.

(51) Int. Cl.
*G01R 29/02* (2006.01)
*H03K 9/08* (2006.01)

(52) U.S. Cl. .................. 327/34; 327/35; 327/36; 327/385; 326/46

(58) Field of Classification Search ............. 327/34–36, 327/46, 385
See application file for complete search history.

(56) References Cited

U.S. PATENT DOCUMENTS

| | | | | |
|---|---|---|---|---|
| 4,926,072 A | * | 5/1990 | Hyodo | 327/22 |
| 5,500,836 A | * | 3/1996 | Jeannet | 368/187 |
| 6,731,711 B1 | * | 5/2004 | Jun | 375/368 |

\* cited by examiner

*Primary Examiner*—Quan Tra
*Assistant Examiner*—Colleen O' Toole
(74) *Attorney, Agent, or Firm*—William B. Kempler; W. James Brady, III; Frederick J. Telecky, Jr.

(57) ABSTRACT

A deglitch circuit utilizes a first flip-flop coupled to the input signal and a second flip-flop coupled to the output of a circuit with feedback from the output to gates to control first and second inputs to the first flip-flop. In an alternative arrangement, a counter is provided between the output of the first flip-flop and the input to the second flip-flop in order to provide flexibility and the possibility of a longer delay for the circuit.

2 Claims, 2 Drawing Sheets

BIDIRECTIONAL DEGLITCH CIRCUIT

This application claims priority from provisional application Ser. No. 60/627919 filed Nov. 15, 2004.

TECHNICAL FIELD OF THE INVENTION

The present invention relates generally to a deglitch circuit, and more particularly to a compact bidirectional deglitch circuit for an input signal.

BACKGROUND OF THE INVENTION

Signals received from other circuits, whether those circuits are analog or digital in design, often contain a noise signal such as a noise spike, which is often referred to as a "glitch" in the signal. These glitches can cause improper responses from the receiving circuit and therefore require removal by a deglitching circuit. For example, if the input to the circuit is the keyboard of a personal computer, the closing of the keyboard switch may cause the switch to bounce repeatedly producing what appears to be a multiple signals from that key. A deglitch circuit will remove the erroneous signals so that only a single key stroke will be recognized. Deglitching circuits can operate on a single edge of the (pulse) signal or on both edges of the signal. One way to form a two-edge deglitch circuit is to cascade two single edge deglitch circuits. Although this produces the required two edge deglitch function, it also involves redundancy of components and therefore a larger circuit. A single integrated circuit could have, for example, forty (40) separate input signals, twenty-five (25) of which require two edge deglitching and fifteen (15) of which require only single edge deglitching. Thus, the duplication of circuitry involved in the cascaded design takes up a significant portion of the circuit area of the integrated circuit which increases the cost and reduces the yield of the device.

Another way to make a deglitch circuit is to use a state machine. A state machine deglitch circuit can be one of two types. The first type requires that the input signal be synchronized with the clock for the state machine. In this type of design, a glitch which is less than the clock period is ignored. In a second type of state machine, the input signal is not synchronized with the clock. In this design, if the input signal changes at the same time the clock changes, the state machine can enter a metastabile state of operation and the state machine may yield incorrect functionality. Accordingly, there is a need for a small two edge deglitch circuit having a small gate count at which takes up a small area on an integrated circuit.

SUMMARY OF THE INVENTION

It is a general object of the present invention to provide a bidirectional deglitch circuit of compact design.

This and other objects and features are obtained, in accordance with one aspect of the invention, by a deglitch circuit comprising a first flip-flop circuit having first and second inputs and having an output. A second flip-flop circuit coupled to the output of the first flip-flop circuit and having an output, and a feed back circuit coupled to the output of the second flip-flop circuit for disabling one of the first and second inputs and enabling the other.

A second aspect of the invention includes a deglitch circuit comprising a first flip-flop circuit having first and second inputs and having an output. A counter circuit coupled to the output of the first flip circuit and having an output. A second flip-flop circuit coupled to the output of the counter circuit and having an output. A feedback circuit coupled to the output of the second flip-flop circuit for disabling one of the first and second inputs and enabling the other.

A third aspect of the invention comprises a method of deglitching a signal comprising inputting the signal to be deglitched to a first input and a second input to a first flip-flop circuit. Coupling an output of the first flip-flop circuit to an input of a second flip-flog circuit. Controlling the first and second inputs to the first flip-flop circuit utilizing an output of the second flip-flop circuit to enable one of the first and second inputs and disable the other.

DETAILED DESCRIPTION OF THE PRESENT INVENTION

Figure 1:
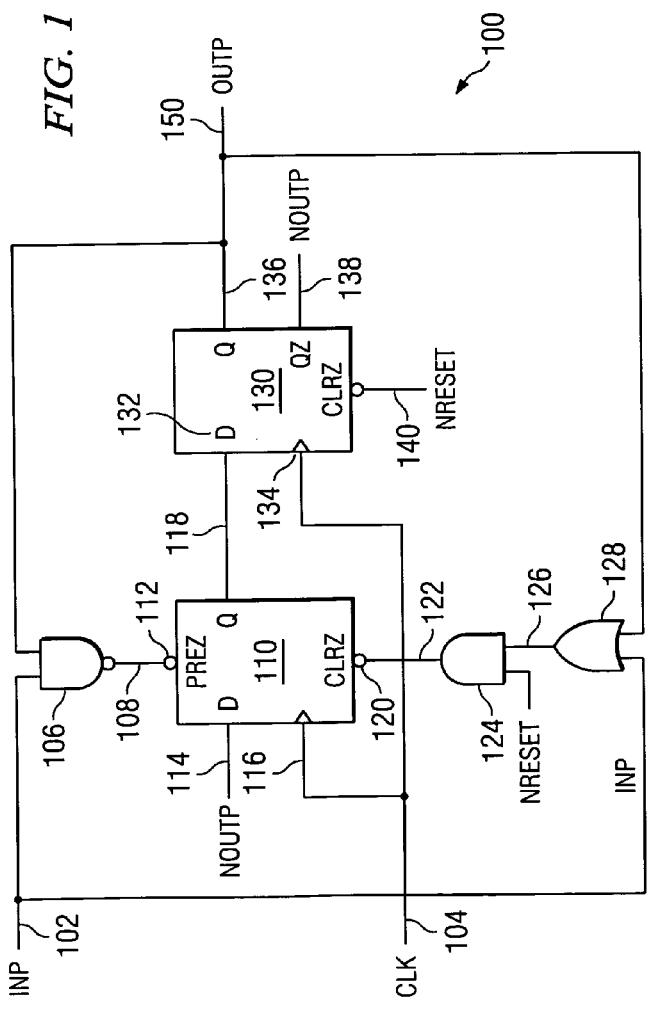
FIG. 1 is a schematic diagram of a deglitch circuit in accordance with the present invention.

An embodiment of the present invention is shown in FIG. 1 generally as 100. The input signal to be deglitched is applied to lines 102. This signal is coupled to the preset input 112 of a flip-flop 110 and to the clear input 120 of the flip-flop. The signal on line 102 is coupled to one input of a two input NAND gate 106 having an output on line 108 which is connected to the input 112. The input signal 102 is also connected to one input of a two input NOR gate 128 having an output on line 126 which is coupled to one input of a two input AND gate 124. The output of AND gate 124 on line 22 is connected to the clear input 120 of flip-flop 110 via line 122. The second inputs of the two input NAND gate 106 and the two input NOR gate 128 are coupled to the output 150 which in turn is coupled to the Q output 136 of a second flip-flop 130. The second input of AND gate 124 is coupled to the system reset signal NRESET which resets the entire system on power up of the integrated circuit. The D input 114 of flip-flop 110 is coupled to the inverted output signal NOUTP which is generated at the QZ output 138 of flip-flop 130. The Q output 118 of flip-flop 110 is coupled to the D input 132 of flip-flop 130. The reset input CLRZ 140 of flip-flop 130 is connected to the system reset signal NRESET. Both flip-flops 110, 130 have their clocks 116, 134, respectively connected to the clock signal line 104.

This circuit deglitches both the rising and falling edges of an input signal, that is, the transitions from zero to one and from one to zero of an input signal. Both the preset input 112 (PREZ) and the clear inputs 120, 140 (CLRZ) are active low and set the Q output to a logic one state or a logic zero state, respectively. The feedback from the output 150 to the second input of gates 106 and gate 128 controls which input 112, 120 is active for flip-flop 110. If the output 150 is a logic zero, this will force the output of NAND gate 106 to be a one, regardless of the input signal on line 102. This disables the preset input 112 of the flip-flop 110. Therefore, the only activity can take place either via the clock signal on line 104 or the CLRZ input at input 120. The signal being delivered to the second input of OR gate 128 is also a logic zero. Thus, the input signal on line 102 controls the output of OR gate 128. The system reset signal NRESET is also active low, and is therefore a logic one once the system has been reset on power up. Therefore, the input signal on line 102 will be applied to the CLRZ input 120 of flip-flop 110. This will set the Q output 118 of flip-flop 110 to a logic zero on the next clock pulse on line 104 which is coupled to the clock input 116. The Q output 118 is coupled to the data input 132 of flip-flop 130. On the clock pulse on line 104 which follows the clock pulse that set the flip-flop 110 to a logic zero, a logic zero will be clocked into flip-flop 130, which will set the Q output of 136 of flip-flop 130 to a logic zero. The inverted Q output, QZ 138 is the inverse of the signal on line 150. This is coupled to the data input 114 of flip-flop 110.

The deglitch time of the circuit shown in FIG. 1 is between one and two clock pulses. If the input changes just before a clock pulse, the first clock pulse will clock that logic level into flip-flop 110, and the second clock pulse will clock it into flip-flop 130. Thus, the deglitch time will be just over one clock period. However, if the data changes just after a clock pulse, the logic level of a signal will not be clocked into flip-flop 110 until almost one clock period has passed, and then another clock period will be required to clock this logic level into flip-flop 130.

If the input signal on line 102 now changes to a logic one, the output on line 150 will still be a logic zero. Thus, the gate 106 will still be forced to have a high output which will still disable the PREZ input 112 of flip-flop 110. The input signal on line 102 will still proceed through OR gate 128 since the OR gate is controlled by the input signal. This places a logic one on the CLRZ input 120, which disables that input as well. Accordingly, both of the asynchronous inputs, PREZ 1120 and CLRZ 120, have been disabled. Thus, the flip-flop 110 can only operate synchronously with the clock signal on line 116. The data input of 114 of flip-flop 110 is connected to the QZ output 138 of flip-flop 130. Therefore, if the output on line 150 is a logic zero the output NOUTP on line 138 will be a logic one, which is coupled to the data input 114. Accordingly, on the first clock pulse on line 116, the flip-flop will be set to a logic one. The Q output 118 of flip-flop 110 is connected to the data input 132 of flip-flop 130. Therefore, on the second clock edge on clock input 134, flip-flop 130 will also be set to a logic one. Again the delay will be between one or two clock pulses, depending on whether the clock edge occurs just after the input signal has changed to a logic one or just before the input changes to a logic one, as discussed above.

In operation, the circuit of FIG. 1 performs the deglitch operation as follows. If, for example, the input signal had transitioned from a logic zero to a logic one, as discussed above, the output 150 would be at a logic zero. Therefore, the PREZ input 112 would be disabled and the input signal on line 102 would control the CLRZ input 120. This signal is at a logic one, which would disable the CLRZ input 120. On the first clock cycle, the D input 114 to flip-flop 110 would receive the NOUTP signal on line 138 which is a logic one, and the flip-flop 110 would be set to a logic one. If the signal on line 102 now goes back to a zero, because the input signal was a glitch, this will re-enable the CLRZ input 120 but not the PREZ input 112. Thus, on the next clock cycle, the logic one appearing at the Q output 118 will not be transferred to flip-flop 130 because the flip-flop will be reset by the now active CLRZ signal at input 120. Thus, for a signal to get past the deglitch circuit, it must remain in its new state for two clock edges which can take between one and two clock cycles, as discussed above. Signals that are less than one clock period are ignored. Signals that last between one and two clock periods may or may not pass through the deglitch circuit. And signals that are longer then 2 clock periods pass through the deglitch circuit. Generally, the situations in which the present invention is utilized are such that the uncertainty period between one and two clock cycles is not important. For example, if one were utilizing this circuit to remove glitches caused by the closing of a contact key in a keyboard, one might use a 1 kHz clock to produce a 1 millisecond clock cycle, which would make the circuit ignore signals less than 1 millisecond and perhaps ignore signals as long as 1 to 2 milliseconds in duration. Signals longer than 2 ms would always pass through the circuit. For removing glitches caused by key bounce, this is generally adequate, because the switch will remain closed for a much longer period of time than 2 milliseconds and the key bounce should be over with at the end of 1 millisecond. An alternative embodiment in which there is greater control over the length of the deglitch time is presented below in connection with FIG. 2.

In deglitching a signal transitioned from a one to a zero, the circuit functions in a similar fashion, except that the PREZ input 112 will be the one controlling the operation of the flip-flop, and the CLRZ input 120 will be disabled. Thus, the present invention can handle signal transitions from a logic zero to a logic one or from a logic one to a logic zero without the need to cascade circuits which results in redundancy of circuitry, and therefore takes up much more room than the indicated circuit.

Figure 2:
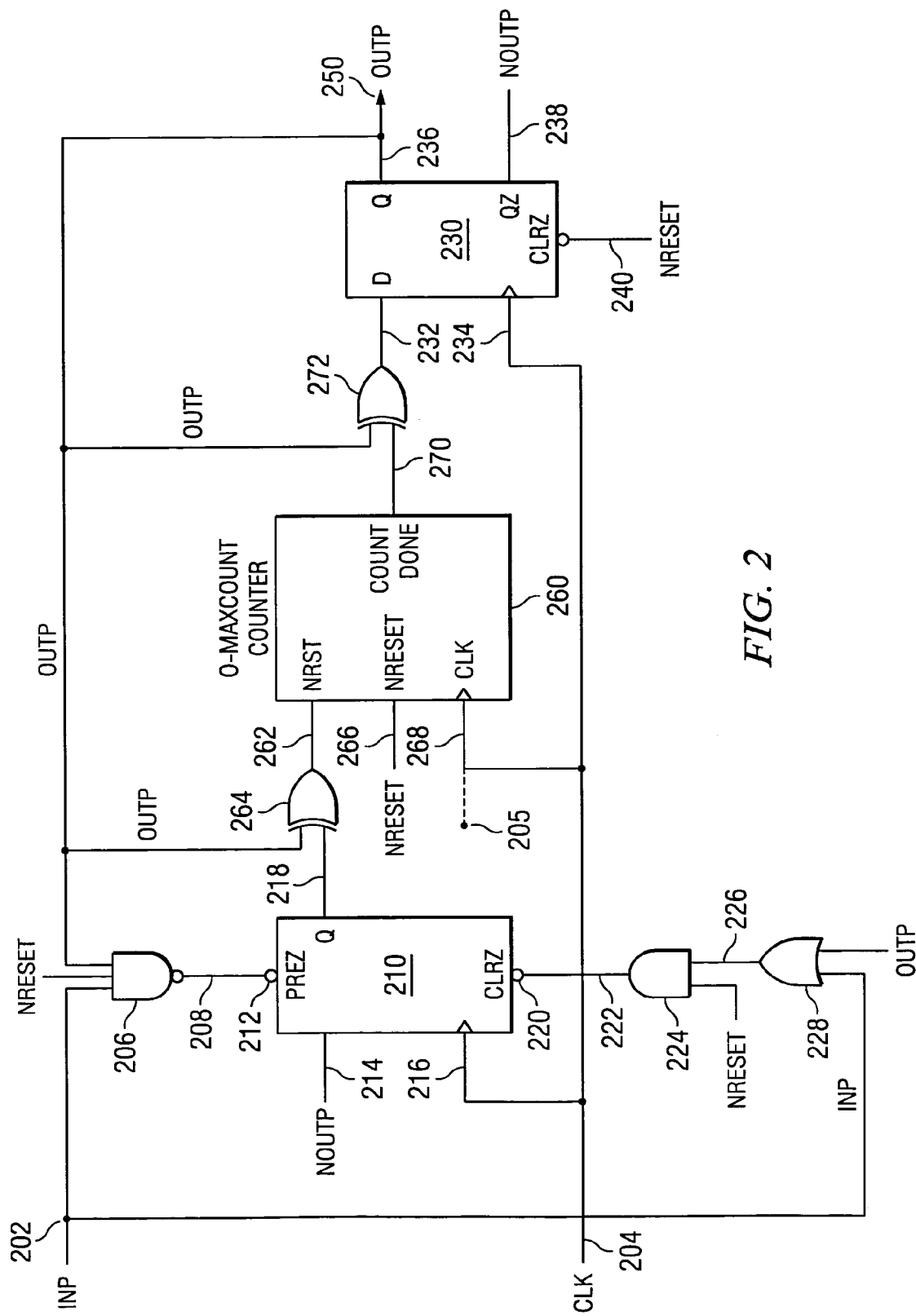
FIG. 2 is a schematic diagram of a second embodiment of the present invention.

FIG. 2 illustrates an alternative embodiment of the present invention. The circuit of FIG. 2 is identical with respect to the flips-flops and the gates that control the first flip-flop. These identical parts have similar reference numerals to the reference numerals of FIG. 1. Between the output 218 of flip-flop 210 and the input 232 of flip-flop 230, a counter circuit comprising counter 260 and two exclusive OR gates 264, 272 have been added. The Q output 218 of flip-flop 210 is coupled to one input of 2 input exclusive OR gate 264. The other input of gate 264 is connected to the output signal OUTP at 250. The output of OR gate 264 is connected to the NRST input 262 of counter 260. The "counter done" output 270 of counter 260 is connected to one input of two input exclusive OR gate 272. The second input of this gate is connected to the output 250. The output of the gate is connected to the D input 232 of flip-flop 230. In a first embodiment of the circuit of FIG. 2, the clock input 268 is connected to the clock signal line of 204. The counter of 260 can be a count up or count down counter; a count up counter is shown in FIG. 2.

In this circuit arrangement, whenever the input is not the same as the output, the counter 260 starts counting. Therefore, the counter is counting when the input has changed and the output has not changed. After the counter reaches the maximum count (or minimum count) this indicates that the input signal has been stable for the clock count plus the delay that was discussed above in connection with the FIG. 1 circuit. The output of the counter toggles the flip-flop 230 just as the circuit in FIG. 1 toggled the flip-flop 130. If the signal 218 matches the old output signal 250 before the counter has reached maximum count (or minimum count), this indicates a glitch. The output of the exclusive OR gate 264 will reset the counter to its default value, such as zero, and the output will not be toggled.

If a large delay is implemented utilizing the counter 260, when compared to the delay of between one and two clock cycles provided by the flip-flops, 210, 230, then the uncertainty in the delay caused by the two flip-flops being one or two clock edges will be so small they can be neglected. One way to provide this without having to have a very large counter is in an alternative version of FIG. 2. The circuit is the same except that the clock 268 for the counter 260 is not connected to the clock line 204, but instead connected to a separate clock line 205, which is shown in dashed lines in FIG. 2. This allows the clock on line 205 to be a much slower clock than the clock provided on line 204, which results in sufficient delay to provide the deglitch function which is essentially independent of the one to two clock edges delay introduced by the two flip-flops, without the need for a larger counter. The slower clock provided on line 205 may already be available on the integrated circuit, so that no additional circuitry is required to generate this clock signal.

Figure 3:
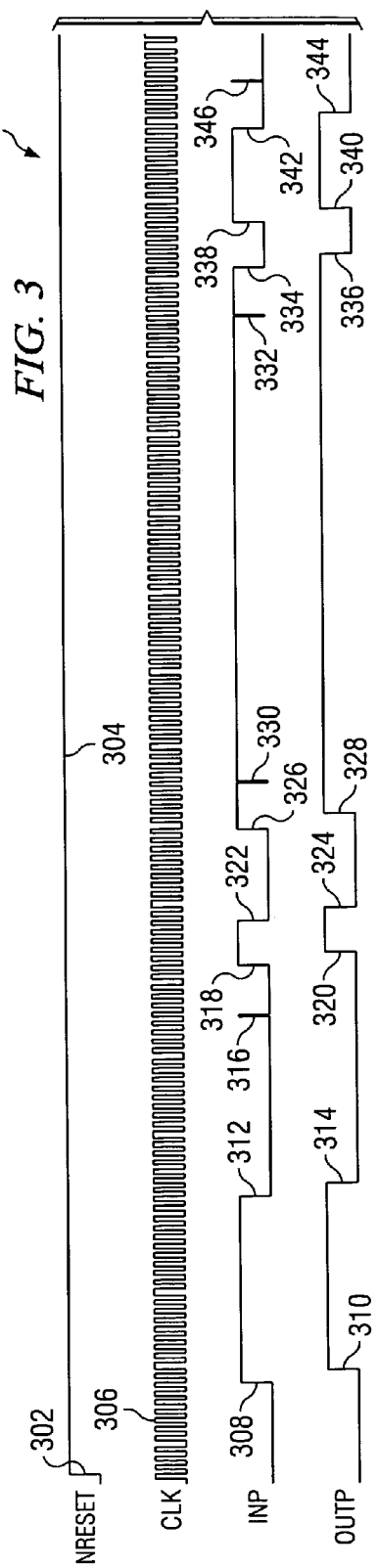
FIG. 3 is a simulation of the operation of the circuit of FIG. 1.

FIG. 3 shows a simulation of the circuit of FIG. 1, generally as 300. The signal N reset 304 shows an active low period 302 which resets all of the devices within the circuit and then remains in a logic one state. The clock signal CLK is illustrated as 306. The input signal INP shows rising edges 308, 318, 326 and 338 and falling edges 312, 332, 334, and 342. The input signal also shows rising glitches 316, 346 and falling glitches 330, 332. The output waveform OUTP likewise shows the rising edges, 310, 320, 328, and 340 and the falling edges 314, 324, 336 and 344. However, the glitches do not appear in the output waveform showing that the circuit of FIG. 1 has successfully removed the glitches without effecting the input weight form except for the delay.

The deglitch circuits illustrated herein are very compact and utilize less space on the integrated circuit than other designs. Utilizing the circuit of FIG. 2 allows for a programmable delay time by utilizing a programmable counter which allows the deglitch time to be adjusted without changing the circuit configuration. This circuit also has a lower error margin because the delay time introduced by the flip-flops can be made very small compared to the delay time provided by the counter, making the variation in the glitch time between one and two clock edges negligible. Furthermore, either circuit is "JTAG scan friendly" because the flip-flops and counters can be easily scanned by disabling the preset and clear inputs and utilizing a scan clock and test vectors.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A deglitch circuit comprising:
 a first flip-flop circuit having first and second inputs and having an output;
 a counter circuit coupled to the output of the first flip-flop circuit and having an output;
 a second flip-flop circuit coupled to the output of the counter circuit and having an output; and
 a feedback circuit coupled to the output of the second flip-flop circuit for disabling one of the first and second inputs and enabling the other wherein the counter is triggered by a change in the output of the first flip-flop circuit with respect to the output of the second flip-flop circuit, and wherein the counter is triggered by an exclusive OR of the outputs of the first and the second flip-flop circuits.

2. The deglitch circuit of claim 1 wherein the counter has a different clock signal than the flip-flop circuits.

* * * * *